(12) United States Patent
Joo et al.

(10) Patent No.: US 6,893,922 B2
(45) Date of Patent: May 17, 2005

(54) NON-VOLATILE MEMORY DEVICE AND MANUFACTURING METHOD THEREOF

(75) Inventors: Kwang Chul Joo, Kyoungki-do (KR); Kee Jeung Lee, Seoul (KR)

(73) Assignee: Hyundai Electronics Industries Co., Ltd., Ich'on (KR)

( * ) Notice: Subject to any disclaimer, the term of this patent is extended or adjusted under 35 U.S.C. 154(b) by 120 days.

(21) Appl. No.: 10/121,509

(22) Filed: Apr. 15, 2002

(65) Prior Publication Data

US 2002/0109142 A1 Aug. 15, 2002

Related U.S. Application Data

(62) Division of application No. 09/751,446, filed on Jan. 2, 2001, now Pat. No. 6,396,099.

(30) Foreign Application Priority Data

Dec. 30, 1999 (KR) .......................... 1999-67182

(51) Int. Cl.⁷ ............................. H01L 21/336
(52) U.S. Cl. ....................... 438/261; 438/260
(58) Field of Search ................ 257/314–326; 438/257–267

(56) References Cited

U.S. PATENT DOCUMENTS

| | | | | | |
|---|---|---|---|---|---|
| 5,753,559 | A | * | 5/1998 | Yew et al. | 438/398 |
| 6,054,733 | A |   | 4/2000 | Doan et al. | |
| 6,204,203 | B1 | * | 3/2001 | Narwankar et al. | 438/785 |
| 6,259,130 | B1 | * | 7/2001 | Wu | 257/314 |
| 6,352,865 | B2 | * | 3/2002 | Lee et al. | 438/3 |
| 6,396,099 | B2 | * | 5/2002 | Joo et al. | 257/315 |
| 6,448,128 | B1 | * | 9/2002 | Lee et al. | 438/240 |

* cited by examiner

Primary Examiner—Carl Whitehead, Jr.
Assistant Examiner—Marcos D. Pizarro-Crespo
(74) Attorney, Agent, or Firm—Pillsbury Winthrop LLP

(57) ABSTRACT

A non-volatile memory device and a manufacturing method thereof are disclosed. The non-volatile memory device includes a gate insulating film formed on a semiconductor substrate, a floating gate formed on the gate insulating film, a dielectric film comprising a $(TaO)_{1-x}(TiO)_xN$ film on the floating gate, and a control gate formed on the dielectric film. Thus, large charge capacitance values can be obtained compared to a similarly sized device using an ONO or $Ta_2O_5$ thin film dielectric while simultaneously simplifying the manufacturing process.

13 Claims, 2 Drawing Sheets

NON-VOLATILE MEMORY DEVICE AND MANUFACTURING METHOD THEREOF

CROSS REFERENCE TO RELATED APPLICATION

This application is a Divisional of U.S. application Ser. No. 09/751,446 filed Jan. 2, 2001, now U.S. Pat. No. 6,396,099 issued May 28, 2002 to Joo et al., the specification and drawings of which are incorporated herein by reference.

BACKGROUND OF THE INVENTION

1. Field of the Invention

The present invention relates to a non-volatile memory device and a method for manufacturing such devices and, more particularly, to a non-volatile memory device having a dielectric film exhibiting high permitivity and superior electric properties produced according to the disclosed manufacturing method.

2. Description of the Related Art

In general, semiconductor memory devices can be divided into two main types according to the manner in which they store. The basis of this division is that volatile memory devices, such as DRAM (dynamic random access memory), must periodically restore the data and non-volatile memory devices such as SRAMs (static random access memory) and flash memories, do not need to periodically restore the data.

These two basic types of memory devices have different advantages and disadvantages that tend to make one type more suitable for a particular application. Engineers and designers typically evaluate the product needs and select the appropriate type of memory best suited for the particular application. In the case of flash memory devices, a type of non-volatile memory device, the demand is gradually increasing with the expanding market for portable electronic products. A dielectric film is used in the cell transistors of a flash memory device to insulate both a floating gate and a control gate. This dielectric film simultaneously functions as a dielectric layer in the cell capacitors of the flash memory.

A conventional ONO (oxide film/nitride film/oxide film) dielectric thin film, although commonly used as a dielectric film in flash memory devices, does not provide sufficient capacitance for operating the next generation flash memory products. In particular, it is difficult to reduce the thickness of an oxide film grown on heavily doped polysilicon using a thermal oxidation method without suffering a deterioration in the electrical properties. This deterioration is due to the high phosphorous (P) concentration in the floating gate, a high defective density, and irregularity and non-uniformity in the oxide produced by oxidizing the heavily doped polysilicon. Each of these factors lowers the effective capacitance, thereby preventing sufficient capacitance from being obtained.

Thus, a $Ta_2O_5$ thin film which may be broadly applied to DRAM products over 256M bytes may also be widely utilized as a dielectric film in flash memory devices. However, because the $Ta_2O_5$ film has an unstable stoichiometry, substitution type tantalum atoms (vacancy atoms) are generated as a result of differences in the combination ratio between tantalum (Ta) and oxygen (O) existing in the deposited thin film. In the $Ta_2O_5$ film, the substitution type tantalum atoms in an oxygen vacancy state always exist as a result of the unstable composition of the film itself. Thus, to compensate for the naturally unstable stoichiometry of $Ta_2O_5$ and prevent leakage current, a separate post-deposition oxidation process to more completely oxidize the substitution type tantalum atoms is required.

Also impurities such as, carbon (C) atoms, carbon compounds ($CH_4$ and $C_2H_4$) and water ($H_2O$) are created during the formation of the thin film as a result of reactions between the organometallic $Ta(OC_2H_5)$ precursor to the $Ta_2O_5$ film and $O_2$ (or $N_2O$) gases. These impurities are, in turn, incorporated into the film, increasing leakage current generated from the floating gate of a cell transistor through the dielectric film, thereby deteriorating the dielectric properties.

For these reasons, $Ta_2O_5$ thin films are not generally applicable as the dielectric film for a cell transistor in flash memory devices.

SUMMARY OF THE INVENTION

To solve the above problem, it is an objective of the present invention to provide a method for manufacturing a non-volatile memory device that provides sufficient capacitance to meet the needs of a highly integrated memory devices.

It is another objective of the present invention to provide a non-volatile memory device having superior electric properties by using a dielectric film having high permitivity, and a method for manufacturing such a device.

It is yet another objective of the present invention to provide a method for manufacturing non-volatile memory devices in which the number of manufacturing process steps are reduced, the manufacturing cost is reduced, and the productivity is improved.

Accordingly, to achieve the above objectives, there is provided a non-volatile memory device comprising a semiconductor substrate, a gate insulating film formed on the semiconductor substrate, a floating gate formed on the gate insulating film, a dielectric film formed of a $(TaO)_{1-x}(TiO)_xN$ on the floating gate, and a control gate formed on the dielectric film.

Also, to achieve the above objectives, there is provided a method for manufacturing a non-volatile memory device comprising the steps of providing a semiconductor substrate, forming a gate insulating film on the semiconductor substrate, forming a floating gate on the gate insulating film, forming a dielectric film by depositing $(TaO)_{1-x}(TiO)_xN$ on the floating gate, and forming a control gate on the dielectric film.

Also, to achieve the above objectives, there is provided a method for manufacturing a non-volatile memory device comprising the steps of providing a semiconductor substrate, forming a gate insulating film on the semiconductor substrate, forming a polysilicon layer and a hemispherical grain polysilicon layer for a floating gate on the gate insulating film, nitrifying the hemispherical grain polysilicon layer, forming a dielectric film by depositing $(TaO)_{1-x}(TiO)_xN$ on the and the nitrified hemispherical grain polysilicon layer, inducing crystallization of the dielectric film through a thermal process using an electric furnace or a rapid thermal process on the surface of the dielectric film, and forming a control gate on the dielectric film.

BRIEF DESCRIPTION OF THE DRAWINGS

The above objectives and advantages of the present invention will become more apparent in light of the following detailed description and the attached figures.

DETAILED DESCRIPTION OF THE INVENTION

Figure 1:
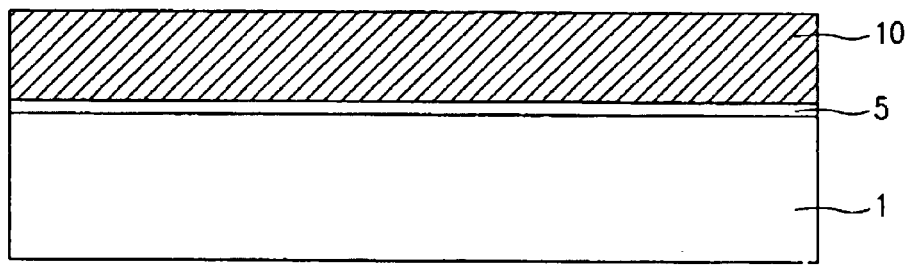
FIGS. 1 through 5 are sectional views illustrating a sequence of steps in the manufacture of a non-volatile memory device according to the present invention.

Referring to FIG. 1, in a method of manufacturing a non-volatile memory device according to the present invention, a gate insulating film 5 is formed by growing a thin oxide film on a semiconductor substrate 1. Next, a conductive layer 10 for a floating gate is preferably formed by depositing a doped polysilicon film using a low pressure chemical vapor deposition (LPCVD) method, for example, on the gate insulating film 5. The conductive layer 10 may also be formed from a material selected from a group consisting of metals such as TiN, TaN, W, WN, WSi, Ru, $RuO_2$, Ir, $IrO_2$ and Pt, or may have a stacked layer structure with both a metal film and a polysilicon film.

Figure 2:
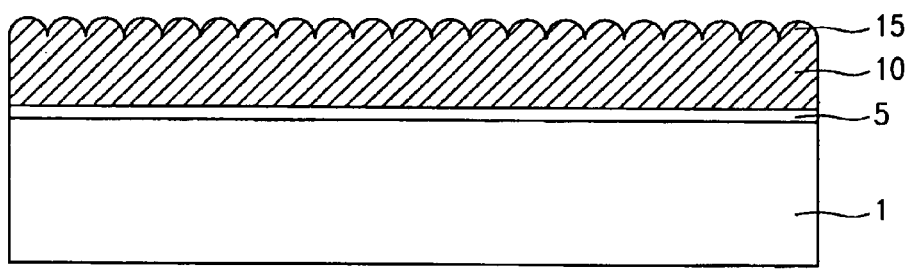

Next, as shown in FIG. 2, to increase the charge capacitance of a cell transistor, a polysilicon layer 15 having a hemispherical grain (HSG) surface is formed on the conductive layer 10 using conventional methods. Further, the conductive layer 10 may be formed as a three-dimensional structure, such as a double stack structure, a cylindrical structure, or a double cylindrical structure, to increase the charge capacitance of the resulting cell transistor.

Figure 3:
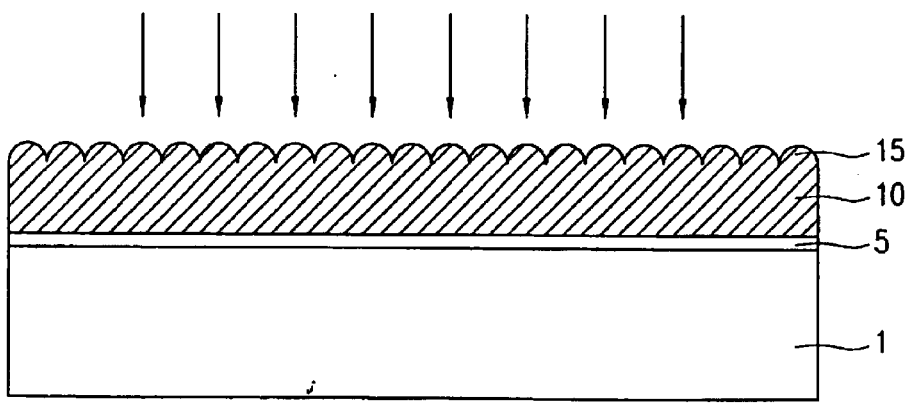

Then, as shown in FIG. 3, the HSG polysilicon layer 10 is nitrified in an in-situ or ex-situ manner just prior to the deposition of the dielectric layer, thereby preventing the formation of an oxide film ($SiO_2$) having low permitivity from being formed at the interface between the polysilicon layer 15 and the dielectric film (not shown) during the subsequent deposition and thermal processing of the dielectric film.

In this instance, the surfaces of the conductive layer 10 and the HSG polysilicon layer are nitrified by discharging plasma at a temperature between 300–600° C. in an atmosphere of $NH_3$ gas or $H_2/N_2$ for 1–5 minutes. Also, in the nitrification process, the nitrification may be performed by annealing the wafer at a temperature between 650–950° C. in an atmosphere of $NH_3$ using a rapid thermal process (RTP). Additionally, before nitriding the surface of the polysilicon layer 15 and after the formation of conductive layer 10, any natural oxide film may be removed using an in-situ HF vapor or an ex-situ HF solution.

Also, before and/or after the oxide removal step using the HF, the wafer may be cleaned by using a compound such as a $NH_4OH$ solution and/or a $H_2SO_4$ solution to clean the boundary surface and improve uniformity. Here, when the plasma or RTP process is used to increase the oxidation resistance of the conductive layer 10, the surface of the conductive layer 10 is nitrified at a temperature between 300–950° C. in an $NH_3$ or $N_2/H_2$ atmosphere, or undergoes a thermal process in an $NO_2$ or $O_2$ atmosphere. The leakage current properties can be improved by minimizing a structural defects or structural irregularities caused by dangling bonds.

Figure 4:
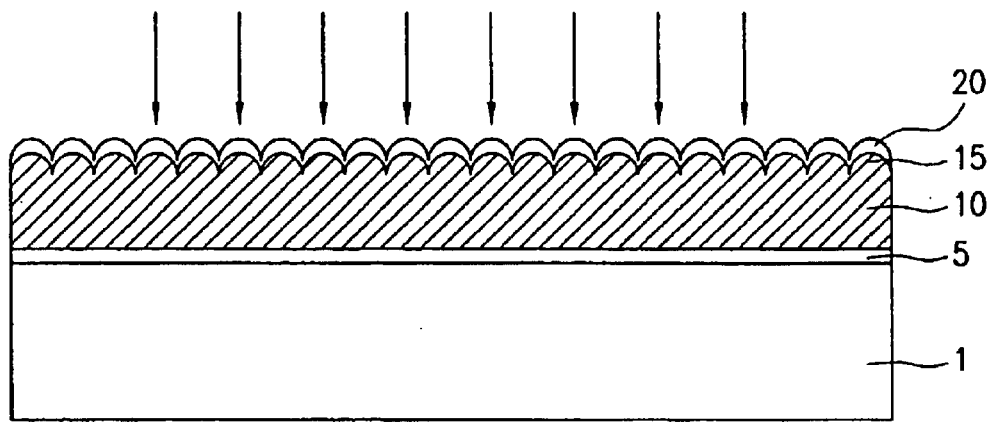

Next, as shown in FIG. 4, an amorphous $(TaO)_{1-x}(TiO)_xN$ (0.01≦x≦0.09) thin film 20 is deposited on the nitrified polysilicon layer 15 to have a appropriate thickness, such as less than 150 Å while a gas phase reaction is restricted in a LPCVD chamber. A Ta, chemical vapor is obtained by vaporizing a predetermined amount of tantalum ethylate ($Ta(OC_2H_5)_5$) solution supplied through a flow controller such as an MFC (mass flow controller) to a vaporizer operating at a temperature between 140 and 200° C.

Similarly, the Ti chemical vapor may be obtained by vaporizing a predetermined amount of a Ti compound such as titanium isopropylate $Ti[OCH(CH_3)_2]_4$ supplied through a flow controller operating at a temperature between 200 and 300° C. The Ti chemical vapor can also be obtained from using compounds such as titanium tetrachloride ($TiCl_4$) TDMAT (tetrakis-dimethylamido-Ti) or TDEAT (tetrakis-diethylamodo-Ti).

The chemical vapors obtained from the vaporizer is then provided to a LPCVD chamber in combination with a reaction gas, preferably a mixture of $NH_3$ and $O_2$ supplied at a rate of 10–1000 sccm. Further, the quantities of the chemical vapors fed to the LPCVD chamber are preferably adjusted to provide a mole ratio of Ti/Ta of 0.01–1.0. The conditions in the LPCVD chamber are then set and controlled to induce a surface chemical reaction that will produce the desired $(TaO)_{1-x}(TiO)_xN$ thin film 20.

Next, to remove the impurities, such as carbon compounds, that were incorporated into the amorphous $(TaO)_{1-x}(TiO)_xN$ thin film 20 as by-products of the reaction, induce crystallization and increase permitivity, the amorphous $(TaO)_{1-x}(TiO)_xN$ thin film 20 is treated using a thermal process at a temperature between 650–950° C. in an $N_2O$ (or a mixture of $O_2$ and $N_2$) atmosphere for 5–30 minutes using an electric furnace.

Figure 5:
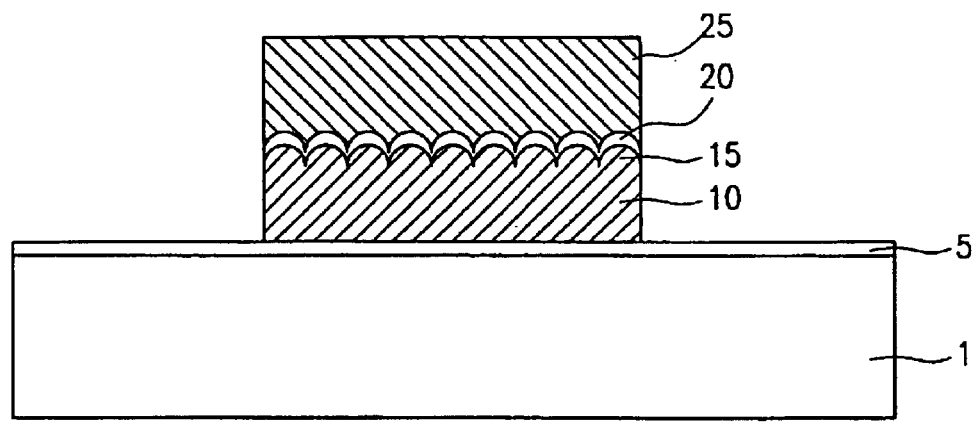

Next, as shown in FIG. 5, a doped polysilicon layer is deposited on the amorphous $(TaO)_{1-x}(TiO)_xN$ thin film 20 to form a conductive layer 25 for a control gate. Alternatively, the conductive layer 25 may be formed from a material selected from a group consisting of metals such as TiN, TaN, W, WN, WSi, Ru, $RuO_2$, Ir, $IrO_2$ and Pt, or by first depositing a metal film to a thickness of 100–600 Å and then depositing a buffer layer of polysilicon to prevent deterioration of the electric properties of the resulting capacitor during subsequent thermal processing. Also, these metal films can be deposited by using PE-CVD or RF magnetic sputtering methods, in addition to LP-CVD.

Next, the conductive layer 25, the $(TaO)_{1-x}(TiO)_xN$ thin film 20, the conductive layer 10, and the polysilicon layer 15 constituting the floating gate are sequentially patterned and etched using conventional lithography and etch methods. Thus, a cell gate electrode is formed from the floating gates 10 and 15, the dielectric film 20 and the control gate 25.

Because the $(TaO)_{1-x}(TiO)_xN$ thin film obtained has a high permitivity, that is, its dielectric constant ∈ is over 40, capacitors having higher capacitances can be fabricated in much less area than required for a conventional device that uses an ONO thin film (∈=4 through 5) or a $Ta_2O_5$ thin film (∈=25).

Also, since the permitivity of the $(TaO)_{1-x}(TiO)_xN$ thin film is high, there is no need to use a complicated three dimensional structure to increase the area of the charge storing electrode. Thus even, if the charge storing electrode is formed with a simple stack structure, sufficient charge capacitance can be obtained.

Also, a cell transistor in a flash memory device utilizing the $(TaO)_{1-x}(TiO)_xN$ thin film as in the present invention can solve the problem of large amounts of leakage current being generated due to carbon impurities or oxygen vacancies typically present in the $Ta_2O_5$ thin film as a result of the unstable stoichiometry and the LPCVD deposition byproducts.

Further, in the present invention, complicated thermal processes such as the rapid thermal annealing (RTA) process performed prior to the $Ta_2O_5$ thin film deposition and the multi-step low temperature oxidation process typically performed after the $Ta_2O_5$ deposition to prevent the leakage current in the conventional method, are not needed and may be eliminated.

Thus, since the number of unit processes is reduced, the time for the processing time is also reduced and the manufacturing cost is correspondingly reduced, the present invention is very cost-effective while still increasing productivity.

Further, because a $TiO_2$ film having a structurally stable tetragonal lattice system is covalent-bonded, the present invention exhibits superior mechanical and electrical properties and is structurally stable, particularly when compared with a $Ta_2O_5$ film. Thus, the present invention can survive electric discharges (ESD) applied from the outside environment and exhibits lower leakage current, thereby providing superior electric properties to the cell transistor than can be obtained using a $Ta_2O_5$ thin film.

Therefore, by using the $(TaO)_{1-x}(TiO)_xN$ thin film of the present invention as the dielectric film in a cell gate electrode, in spite of reduction in a unit cell area according to high integration, the level of charge capacitance needed by the next generation of non-volatile memory devices can be obtained despite the reductions in unit cell area required for highly integrated products.

It is noted that the present invention is not limited to the preferred embodiment described above, and it is apparent that variations and modifications by those skilled in the art can be effected within the spirit and scope of the present invention defined in the appended claims.

What is claimed is:

1. A method of manufacturing a non-volatile memory device comprising the steps of:
   providing a semiconductor substrate;
   forming a gate insulating film on the semiconductor substrate;
   forming a floating gate on the gate insulating film, the floating gate comprising a stacked structure of an inner polysilicon layer and an outer hemispherical grain polysilicon layer;
   nitrifying the hemispherical grain polysilicon layer;
   forming a dielectric film by depositing $(TaO)_{1-x}(TiO)_xN$ on the nitrified hemispherical grain polysilicon layer;
   inducing crystallization of the dielectric film through a thermal process using an electric furnace or a metal thermal process of the surface of the dielectric film; and
   forming a conductive layer for a control gate on the dielectric film.

2. A method for manufacturing a non-volatile memory device comprising the steps of:
   providing a semiconductor substrate;
   forming a gate insulating film on the semiconductor substrate;
   forming a floating gate on the gate insulating film;
   forming a dielectric film by depositing $(TaO)_{1-x}(TiO)_xN$ on the floating gate; and
   forming a conductive layer for a control gate on the dielectric film.

3. The method as claimed in claim 2, wherein the dielectric film is formed by using tantalum ethylate as a precursor.

4. The method as claimed in claim 2, wherein the floating gate is obtained by forming a conductive layer on the gate insulating film and a hemispherical grain (HSG) polysilicon layer on the conductive layer.

5. The method as claimed in claim 2, wherein the $(TaO)_{1-x}(TiO)_xN$ ($0.01 \leq x \leq 0.09$) thin film is deposited using a chemical vapor deposition method such that the mole composition ratio between Ti and Ta of the $(TaO)_{1-x}(TiO)_xN$ thin film should be 0.01–1.0:1.

6. The method as claimed in claim 2, wherein the step of forming a dielectric film by depositing $(TaO)_{1-x}(TiO)_xN$ further comprises
   vaporizing a predetermined amount of a $Ta(OC_2H_5)$ solution at a temperature between 140–200° C.;
   vaporizing a predetermined amount of a Ti-containing solution at a temperature between 200–300° C., the Ti-containing solution comprising a solution of one or more compounds from the group consisting of $Ti[OCH(CH_3)_2]_4$, $TiCl_4$, TDMAT and TDEAT.

7. The method as claimed in claim 2, wherein the step of forming a dielectric film by depositing $(TaO)_{1-x}(TiO)_xN$ further comprises
   supplying a predetermined amount of a Ta chemical vapor to the LPCVD chamber;
   supplying a predetermined amount of a Ti chemical vapor to the LPCVD chamber, the predetermined amounts of the Ta chemical vapor and the Ti chemical vapor being adjusted to provide a Ti:Ta mole ratio of between 1:100 and 1:1;
   supplying a predetermined amount of reaction gases $NH_3$ and $O_2$ to the LPCVD chamber, the predetermined amount being between 10 and 1000 sccm; and
   maintaining conditions within the LPCVD chamber to generate a surface reaction between the Ta chemical vapor, the Ti chemical vapor, and the reaction gases.

8. The method as claimed in claim 2, further comprising a step of nitrifying the surface of the floating gate before forming the dielectric film.

9. The method as claimed in claim 8, wherein the step of nitrifying the floating gate further comprises one treatment step selected from a group consisting of
   treating the floating gate in a plasma reactor at a temperature between 300–600° C. in an atmosphere of $NH_3$ or $N_2/H_2$ for 1–5 minutes;
   treating the floating gate in a rapid thermal process unit at a temperature between 600–950° C. in an $NH_3$ atmosphere; and
   treating the floating gate in an electric furnace at a temperature between 500–1000° C. in an $NH_3$ atmosphere.

10. The method as claimed in claim 2, further comprising the step of removing a natural oxide film from the floating gate, the step of removing the natural oxide film being completed before forming the dielectric film.

11. The method as claimed in claim 10, further comprising the step of cleaning the surface of the floating gate using a $NH_4OH$ solution or a $H_2SO_4$ solution, the step of cleaning the surface of the floating gate being performed immediately before or after the step of removing a natural oxide film.

12. The method as claimed in claim 2, further comprising a thermal treatment of the dielectric layer, the thermal treatment being sufficient to induce crystallization of the dielectric film and to remove organic impurities from the dielectric film.

13. The method as claimed in claim 12, where in the thermal treatment is performed at a temperature between 650–950° C. in an atmosphere comprising at least one gas selected from a group consisting of $N_2O$, $O_2$ and $N_2$.

* * * * *